(12) United States Patent
Chen et al.

(10) Patent No.: US 10,653,992 B2
(45) Date of Patent: May 19, 2020

(54) SERVER DUST COLLECTOR

(71) Applicant: QUANTA COMPUTER INC., Taoyuan (TW)

(72) Inventors: Chao-Jung Chen, Taoyuan (TW); Yu-Nien Huang, Taoyuan (TW); Hou-Hsien Chang, Taoyuan (TW); Kuen-Hsien Wu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 85 days.

(21) Appl. No.: 15/730,937

(22) Filed: Oct. 12, 2017

(65) Prior Publication Data
US 2019/0111375 A1    Apr. 18, 2019

(51) Int. Cl.
| | | |
|---|---|---|
| *B01D 45/12* | (2006.01) | |
| *B01D 50/00* | (2006.01) | |
| *B01D 45/16* | (2006.01) | |
| *B01D 46/10* | (2006.01) | |
| *B01D 46/30* | (2006.01) | |

(Continued)

(52) U.S. Cl.
CPC ........... *B01D 50/002* (2013.01); *B01D 45/16* (2013.01); *B01D 46/0045* (2013.01); *B01D 46/10* (2013.01); *B01D 46/30* (2013.01); *B01D 53/0407* (2013.01); *B04C 9/00* (2013.01); *H05K 7/20181* (2013.01); *H05K 7/20736* (2013.01); *B01D 46/0002* (2013.01); *B01D 46/0004* (2013.01); *B01D 46/0005* (2013.01); *B01D 46/0008* (2013.01); *B01D 2253/102* (2013.01);

(Continued)

(58) Field of Classification Search
CPC .............. B01D 50/002; B01D 53/0407; B01D 46/0045; B01D 46/30; B01D 46/10; B01D 45/16; B01D 2253/102; B01D 2257/708; B01D 2279/45; B01D 46/0002; B01D 46/0004; B01D 46/0005; B01D 46/0008; B04C 9/00; B04C 2009/002; H05K 7/20736; H05K 7/20181
See application file for complete search history.

(56) References Cited

U.S. PATENT DOCUMENTS 2,846,024 A * 8/1958 Bremi ................... B04C 5/04
                                                                    55/413
2,907,406 A * 10/1959 Baden .................. F02M 35/022
                                                                    55/341.1

(Continued)

FOREIGN PATENT DOCUMENTS

| CN | 203492295 U | 3/2014 |
|---|---|---|
| FR | 2240036 A1 | 3/1975 |
| WO | 2016113001 A1 | 7/2016 |

OTHER PUBLICATIONS

Extended European Search Report for EP Application No. 18153464.5, dated Aug. 16, 2018.

*Primary Examiner* — Dung H Bui
(74) *Attorney, Agent, or Firm* — Nixon Peabody LLP; Zhou Lu

(57) ABSTRACT

A coolant gas, multi-filter filtering unit, for use with servers and other electrical equipment that can be utilized as a retrofit device for existing servers or provided as OEM equipment with the server is described. A series of static centrifugal force filtering units are position upstream of a replaceable surface filter. The surface filter can be a HEPA filter, or alternatively include an absorbent layer or separate third filter of charcoal to remove VOCs.

14 Claims, 4 Drawing Sheets

(51) Int. Cl.
  *B01D 46/00*   (2006.01)
  *B01D 53/04*   (2006.01)
  *B04C 9/00*    (2006.01)
  *H05K 7/20*    (2006.01)

(52) U.S. Cl.
  CPC .... *B01D 2257/708* (2013.01); *B01D 2279/45* (2013.01); *B04C 2009/002* (2013.01)

(56) References Cited

U.S. PATENT DOCUMENTS

| | | | | |
|---|---|---|---|---|
| 3,155,474 A * | 11/1964 | Sexton | B01D 45/06 | 55/418 |
| 3,903,404 A * | 9/1975 | Beall | G06F 1/18 | 361/679.4 |
| 3,907,671 A * | 9/1975 | Baigas, Jr. | B01D 45/12 | 209/722 |
| 4,019,883 A * | 4/1977 | Klomp | B01D 45/12 | 96/377 |
| 4,175,036 A * | 11/1979 | Frykhult | B04C 5/103 | 209/734 |
| 4,751,872 A * | 6/1988 | Lawson, Jr. | H05K 7/20181 | 361/679.49 |
| 5,180,486 A * | 1/1993 | Smolensky | B01D 45/12 | 210/195.1 |
| 5,591,253 A * | 1/1997 | Altman | B01D 45/16 | 55/460 |
| 5,904,755 A * | 5/1999 | Kanazashi | F24F 3/1603 | 55/337 |
| 6,334,234 B1 * | 1/2002 | Conrad | A47L 5/30 | 15/347 |
| 7,883,558 B2 * | 2/2011 | Gottung | B01D 45/12 | 55/315 |
| 8,012,227 B2 * | 9/2011 | Greif | B01D 45/16 | 55/337 |
| 8,591,625 B2 | 11/2013 | Iyengar et al. | | |
| 8,707,510 B2 * | 4/2014 | Reed, Jr. | A47L 11/34 | 15/320 |
| 9,222,680 B1 * | 12/2015 | Woodall, III | F24C 15/20 | |
| 2004/0040271 A1 * | 3/2004 | Kopec | B01D 46/0004 | 55/357 |
| 2010/0186353 A1 * | 7/2010 | Ackermann | B01D 46/0021 | 55/321 |
| 2012/0233972 A1 * | 9/2012 | Menssen | B01D 45/16 | 55/325 |
| 2013/0031878 A1 * | 2/2013 | Menssen | B01D 45/16 | 55/345 |
| 2013/0063887 A1 * | 3/2013 | Wang | H05K 7/20736 | 361/679.48 |
| 2013/0327005 A1 * | 12/2013 | Menssen | B01D 46/2411 | 55/493 |
| 2014/0033666 A1 * | 2/2014 | Menssen | B01D 46/2418 | 55/495 |
| 2014/0290194 A1 * | 10/2014 | Muenkel | B01D 46/0024 | 55/482 |
| 2016/0067719 A1 * | 3/2016 | Fill | B01D 45/16 | 55/447 |
| 2017/0304760 A1 * | 10/2017 | Kaufmann | B01D 46/0002 | |
| 2018/0207573 A1 * | 7/2018 | Perl-Olshvang | B04C 5/185 | |
| 2018/0207651 A1 * | 7/2018 | Meirav | B04C 3/04 | |
| 2018/0332737 A1 * | 11/2018 | James | H05K 7/20581 | |

\* cited by examiner

| Speed [m/s] |
| --- |
| 18.0390 |
| 15.7840 |
| 13.5299 |
| 11.2749 |
| 9.01990 |
| 6.76492 |
| 4.50995 |
| 2.25490 |
| 0.00000 |

SERVER DUST COLLECTOR

TECHNICAL FIELD

The present disclosure is directed to protective devices for servers and other electrical equipment that utilize air as a coolant. More particularly, the disclosure provides an apparatus for use in reducing dust, pollen, and other particulate matter buildup in and onto servers and other electrical devices.

BACKGROUND

Servers are known to accumulate a particulate buildup, both by drawing in ambient fluid, such as air, into the server; as well as from static electrical forces which act as an attractant to accumulate particulates from the air present in the environment surrounding the server. The prior art has attempted to reduce the particulates in the environment surrounding the server through conditioning the immediate environment by placing the servers in a "clean room".

In a "clean room", the immediate surrounding air has been filtered before entry into the clean room. The particulates which cause buildup on known servers include many forms of "dust", which can include viruses, bacteria, smoke, and allergens. Examples of allergens are pollen or spores from plant life, hair or dead skin cells from animal life, and other inorganic matter in the form of finely entrained particulates including nano-particles that exist in Brownian movement in isolated air pockets, carried in moving air streams, or are adsorbed onto solid surfaces. "Clean rooms" are expensive to create and maintain in a sterile condition that is free of particulates because of the need for human personnel to enter and exit these rooms to access, maintain, repair, and attend to the servers contained therein. Furthermore, because server usage has become so predominant in many businesses, many of these businesses, particularly small businesses, cannot afford the cost of creating and maintaining clean rooms to house their servers.

In this environment of present day server usage, as well as envisioning the extension of server usage beyond existing business use, there exists a need to protect servers from the accumulation of particulate build-up. The present disclosure provides several embodiments that solve these problems.

SUMMARY

A first embodiment provides for an apparatus in combination with a server, either as an original equipment manufacture ("OEM") or as a retrofit unit that can be mounted onto a server. Normally, a server will have at least one orifice inlet (although there are typically many) into which ambient air will be drawn into the housing of the server, under the influence of a fan, so as to act as a coolant to reduce the temperature of the server by removing heat therefrom by means of convection. In this embodiment, the retrofit apparatus will include a lattice support or framework which can be fastened to the housing of the server over the inlet orifice(s) and the use of at least one elastic strip to fill-in any gap between the retrofit apparatus and the server. The support will include at least one aperture into which a replaceable surface filter is inserted and positioned for effectively covering the inlet orifice(s) in the housing of the server.

The replaceable surface filter is able to mechanically retain particulates flowing there-through, and can optionally retain particulates therein by electrostatic forces as well. This filter can also be a High Efficiency Particulate Accumulator ("HEPA") filter. The HEPA filter can capture many bacteria, viruses, allergens (such as pollens, spores, smoke, etc.), and other relatively small organisms or particles, including nano-particles, that can be found in ambient air.

In addition, it is possible to also include a filter that will remove volatile organic compounds ("VOC"), e.g., certain chemicals, gases, etc., and odors from ambient air. This third filter can be combined as a separate layer on the replaceable surface filter or, in some instances, can be a separate, stand-alone filter, placed downstream of the replaceable surface filter. This third filter may be a charcoal filter.

Additionally, the lattice support or framework can also house a number of centrifugal fiber filter units (positioned upstream of the surface filter) which centrifugal filter units utilize centrifugal force to impel entrained particulates through individual fiber filter units associated with each centrifugal force unit. The fiber filter units, fed by the centrifugal force, effectively reduce the particulate content of the ambient air such that the flow through centrifugal fiber filter units to assure that the replaceable surface filter will not be prematurely filled with particulate matter—thereby extending the service life of the replaceable surface filter.

In a second embodiment, the centrifugal force in each of the centrifugal force filter units is created by a static device channeling the intake flow of fluid from a relatively larger inlet opening and discharging the fluid through a relatively smaller outlet opening. The centrifugal force will, by reason of a pressure drop created by the physical shape and dimensions of the static centrifugal device, deliver entrained particulates into a filter unit immediately downstream of the outlet of the centrifugal device where the particulates will be captured. Such downstream filter unit may take the form of a filter tank which is filled with a plurality of fibers.

Alternatively, the filter tank may house other types of filtering media, such as woven or non-woven fabrics, batts, tapes, blankets, and similar filtering media. The outlet of the centrifugal device, downstream of the filter unit, preferably takes the shape of a plurality of orifices in the back wall of the filter tank. The exiting air, at least partially cleaned of particulates, will then be directed towards the replaceable surface filter.

In a further embodiment, the elastic strips can be utilized to permit access to the housing of the server for example, to permit cable outlet from the server to peripheral equipment.

These and other embodiments will be better understood by reference to the accompanying drawings and the following detailed description of the preferred embodiments.

DETAILED DESCRIPTION

Figure 1:
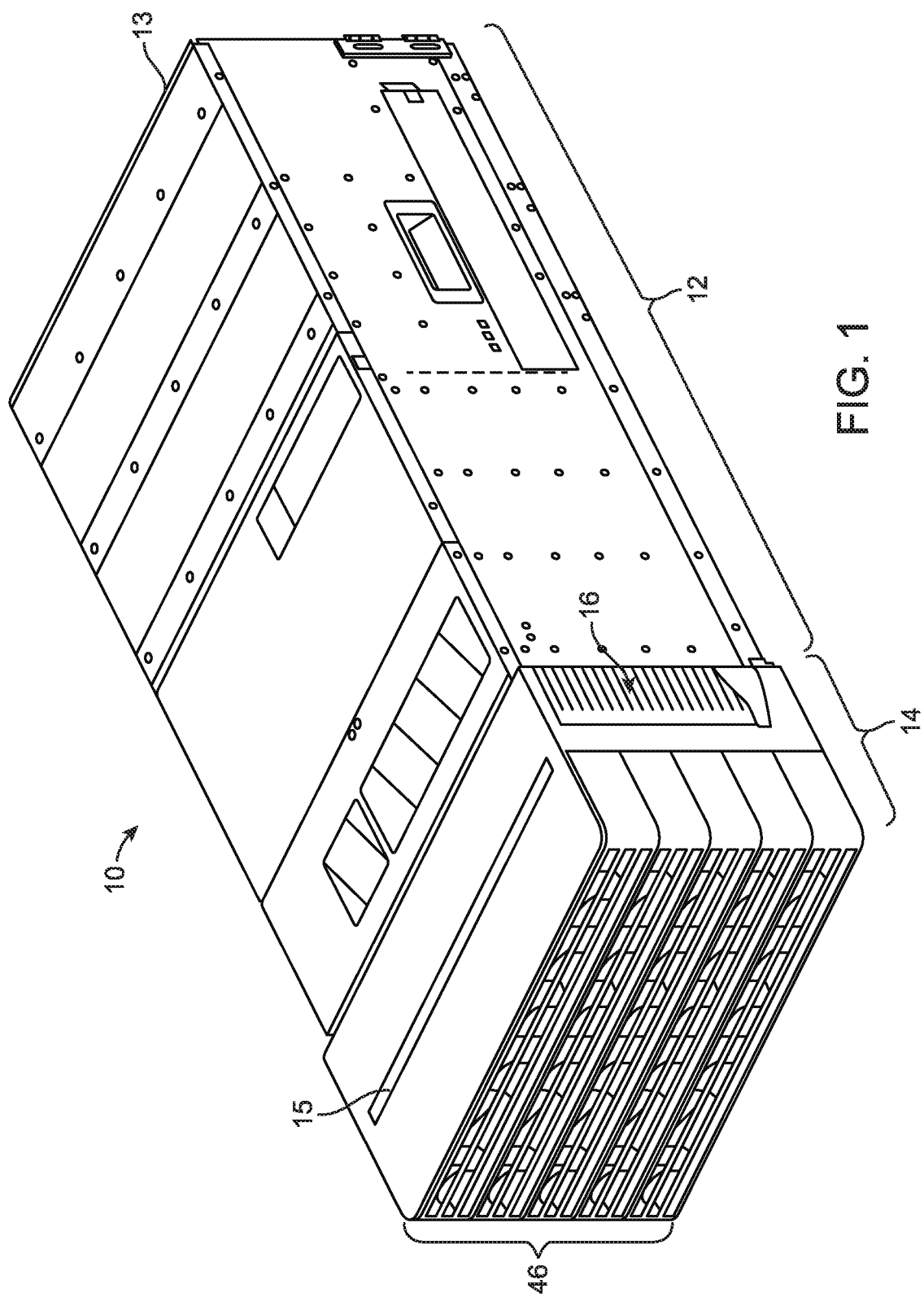
FIG. 1 is a schematic, perspective representation of the combination of a server and the filter assembly of the present disclosure.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 2:
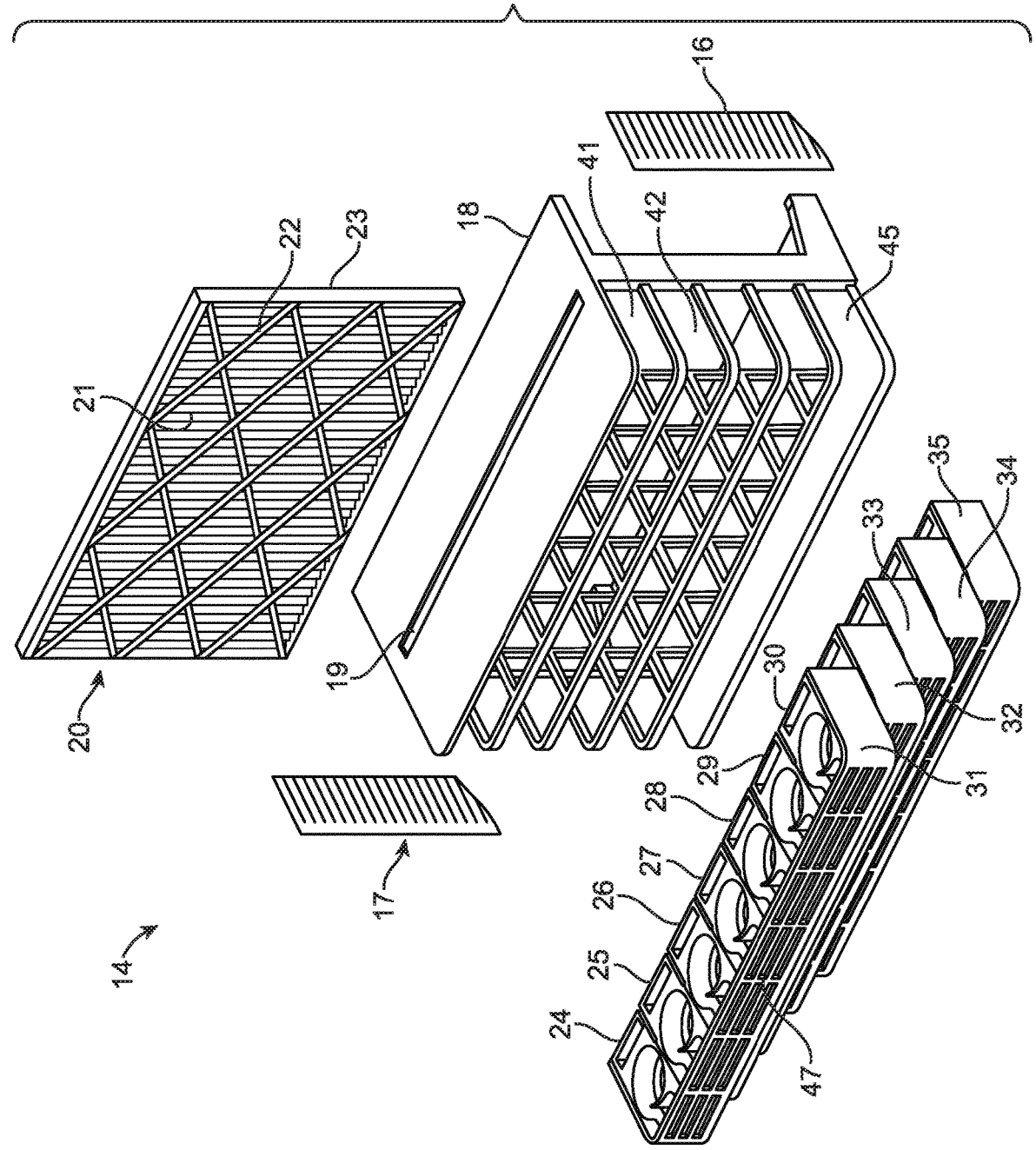
FIG. 2 is a schematic, exploded view of the filter assembly portion of FIG. 1.

Shown at 10 in FIG. 1 is the combination of a server 12 and its attached filter assembly 14. FIG. 2 shows an exploded view of the filter assembly 14 of FIG. 1. Server 12 can be a rack server configured to be received in a slot of a rack (not shown). However, the various embodiments are not limited in this regard. Rather the filter assembly 14 can be used with other types of computing devices. Although a server 12 is exemplary of the type of electronic component to which the filter assembly 14 may be employed in combination, it is to be understood that other electronic components, other than a server, may be used in combination with filter assembly 14. Such other electronic components could include storage, switch and similar electrical systems. As shown in FIGS. 1 and 2, Filter assembly 14 comprises a replaceable surface filter 15 according to a first embodiment. Server 12 (the internal components thereof not being illustrated) comprises a housing 13 upon which filter assembly 14 is mounted. A pair of elastic strips 16, 17 (best seen in the exploded view of FIG. 2), are positioned between the filter assembly 14 and the server 12 to permit access to input/output electrical sockets (not shown) in the server 12. In an alternative embodiment, only one elastic strip could be used, provided that it can extend down (or up) both side surfaces occupied by elastic strips 16 and 17. The elastic strips are provided to permit cable(s) to pass from the server 12 to peripheral equipment (not shown) or electrical connections (including internet access) associated with server 12. Thus, cables (not shown) could be connected to the server and exit beneath the elastic strips 16, 17. The cables can be bundled by a feed-through device, an inner rubber component of the feed-through device will force the air-gap within the cables be minimized or eliminated, thereby minimizing/eliminating any air gap created by the cables passing through/beneath the elastic strips 16, 17.

FIG. 2 is an exploded view of the filter assembly 14 of FIG. 1. Filter assembly 14 comprises a lattice support or framework 18. The lattice support or framework 18 can be formed of metal, plastic, or a composite of metal and plastic. As the plastic, any of the moldable polymers, copolymers, terpolymers, or blends of polyethylene, polypropylene, polystyrene, polyvinylchloride, polyacrylates, epoxies and rubbery polymers, and acrylonitiles, could be employed to form lattice support or framework 18. The polyacrylates include ethyl methacrylate and methyl methacrylate, among others. The acrylonitriles include terpolymers such as acrylonitrile butadiene styrene ("ABS"). Preferably these plastics are reinforced with fillers including carbon black, and preferably including fibers, particularly carbon or graphite fibers, to prevent the build-up of a static electrical charge to attract dust particles. Alternatively, the plastic could be coated with a dust repelling coating, such as polytetrafluoroethylene, to reduce dust build-up on the lattice support 18. These polymers can be easily fabricated by injection molding, as well as by 3-D (three-dimensional) printing. Composites of polymer and metal, as well as filled or fiber-reinforced polymer, provide the most strength, although engineering polymers with enhanced impact resistance could be used without fiber-reinforcement and still yield exceptional strength.

Lattice support 18 defines an aperture 19 therein, into which an extended surface filter 20 can be inserted. Filter 20 permits air or other coolant gas to flow there-through into the inlet orifice(s) (not shown) of server 12. Filter 20 can mechanically entrain particulates in the coolant gas, or can be treated so as to also attract and retain particulates by reason of electrostatic forces. Filter 20 comprises a filter medium 21.

Filter medium 21 can comprise a porous structure, such as a fabric or blanket of woven or non-woven fibers, foamed polymer, or ceramic or other porous structure that will permit the coolant gas to penetrate, but has channels which will filter out particulates in the coolant gas. The material of the woven or non-woven fabric or blanket is not particularly limited, and polyolefins (polyethylene, polypropylene, or the like) polyamide, polyester (such as PET—Polyethylene Terephthalate), aromatic polyamide, polyacrylonitrile, polyvinylidene fluoride, polyvinyl alcohol (PVA), polyurethane, or a composite material of the foregoing, could be employed as the filter medium 21. Additionally, fibrillated membranes of polytetrafluoroethylene (PTFE), either as a homopolymer, or as a modified copolymer, can also be mixed in with any of the foregoing fibers as part of filter medium 21.

A reticulated framework 22, as well as an outer frame 23, supports filter medium 21. Filter 20 can also be a High Efficiency Particulate Accumulator ("HEPA") filter. The HEPA filter can capture many bacteria, viruses, allergens (such as pollens, spores, smoke, etc.), and other relatively small organisms or particles, including nano-particles, that can be found in ambient air. In addition, it is possible to also include as part of filter 20, a component that will remove volatile organic compounds ("VOC"), e.g., certain chemicals, gases, etc., and odors from ambient air. This filter to remove VOCs can be combined as a separate layer on the replaceable surface filter 20 or, in some instances, can be a separate, stand-alone third filter, placed downstream of the replaceable surface filter 20. This additional layer or separate third filter may be a charcoal filter.

In order to extend the service life of filter medium 21, the number of particulates reaching the filter 20 should be minimized as much as possible. Accordingly, the disclosure contemplates providing a pre-filter assembly. This pre-filter assembly can be formed using a plurality of centrifugal force filtering elements. For example, as shown in FIG. 1, the pre-filtering units are arranged in several rows, with a plurality of pre-filters in each row. Although it might be envisioned to employ a single pre-filter to service the entire intake area, only one pre-filter would be too big to service the full intake area, multiple units can minimize the volume of the filter assembly.

As shown in the embodiment of FIG. 2, the pre-filter assembly can include a plurality of centrifugal force filtering units 24, 25, 26, 27, 28, 29 and 30, arranged in row 31. Other centrifugal force filtering units can be arranged in rows 32, 33, 34 and 35, respectively, as are provided according to one embodiment of this disclosure. However, it is to be expressly understood that fewer number of filtering units can be provided in each row. Additionally, it is to be understood that fewer rows can be provided than those shown in the figures without departing from the spirit and scope of this disclosure. In the illustrated embodiment of FIG. 2, row 31 will nest and interfit into lattice space 41; row 32 will nest and interfit into lattice space 42; and so on, respectively, through row 35 fitting into lattice space 45 until the entire intake surface 46 of filter assembly 14 is occupied by the centrifugal filtering units. A screen or latticework 47 can be placed in front of an intake or entry port of the individual centrifugal force units 24-30.

Figure 3:
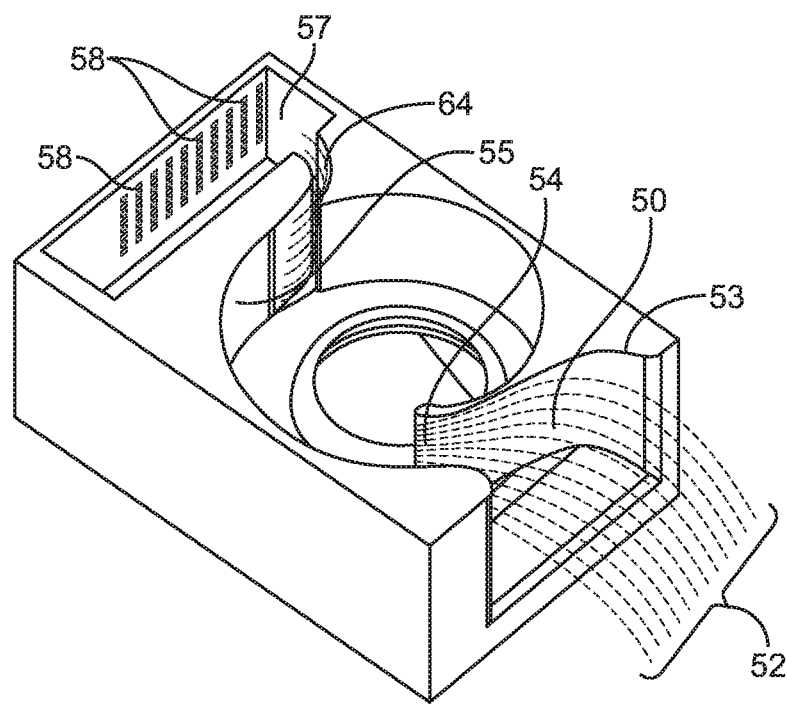
FIG. 3 is a schematic, perspective view of a single centrifugal unit illustrating the top, front and side view exhibiting the intake portion and the filter tank portion.
Figure 4:
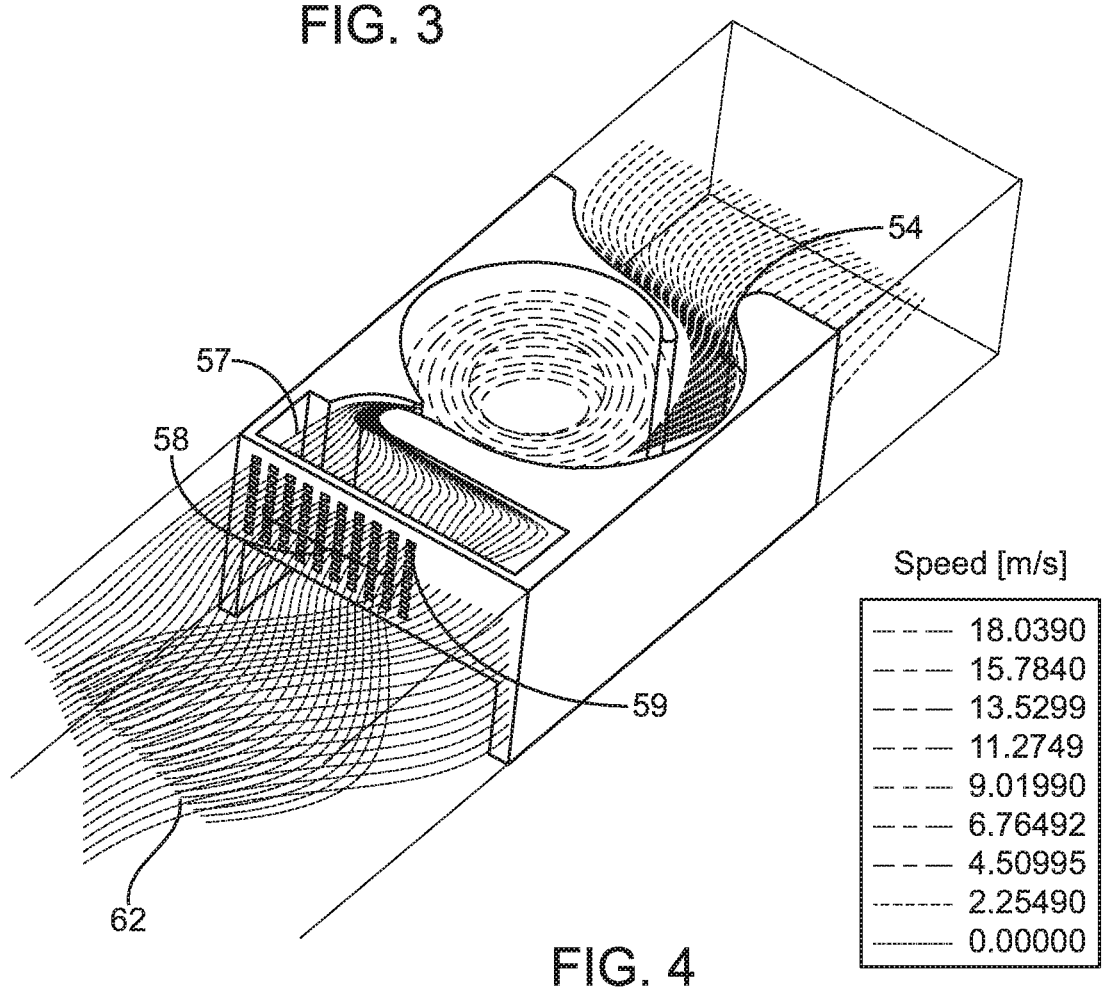
FIG. 4 is a schematic, perspective view of the centrifugal unit of FIG. 3, exhibiting a back wall of the filter tank and the plurality of orifices therein permitting the at least partially cleaned air to exit the centrifugal filter unit.
Figure 5:
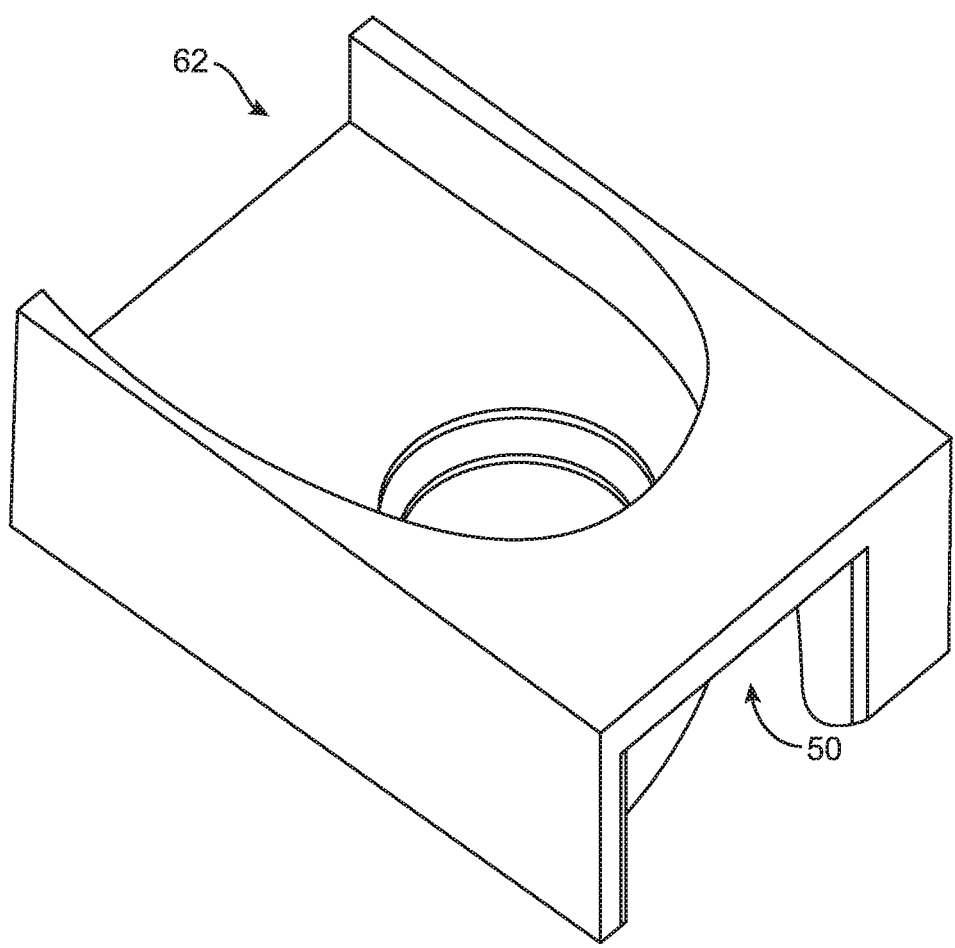
FIG. 5 is a schematic, perspective view of the single centrifugal unit illustrating the bottom, front and side view of FIG. 3.

The structure of an individual centrifugal force unit, for example centrifugal force filtering unit 24, is shown in enlarged detail in FIGS. 3, 4 and 5. Each centrifugal unit comprises an intake 50 into which flows coolant gas 52 containing entrained particulates (not shown). Impinging on primary surface 53 of centrifugal force unit 24, the flow of gas 52 abruptly changes direction and is directed in a turbulent flow through entry port 54 so as to tangentially impinge upon inner wall 55 of centrifugal unit 24. Inner wall 55 imparts a cyclonic flow of the coolant gas 52, carrying entrained particles through exit port 64 of centrifugal unit 24. The entrained particles normally have a higher specific gravity than the coolant gas and are thereby directed along the inner wall 55. Exit port 64 is smaller in area than entry port 54 (best shown in FIG. 4), such that some of the coolant gas continues to flow against inner wall 55 reinforcing the cyclonic flow of newly entering gas into centrifugal force unit 24, while most of the entrained particulates are forced through exit port 64. The pressure drop though centrifugal force unit 24 from entry port 54 through exit port 64, and beyond, is created by the fan(s) (not shown) of server 12, normally provided for introducing coolant gas to reduce the temperature of the server 12. This pressure drop accelerates the flow of the coolant gas when in the centrifugal force unit 24. In this embodiment, the centrifugal force unit 24 has no moving parts and is therefore termed a "static" centrifugal force unit. Upon exit of the cyclonic flow through exit port 64 of centrifugal force unit 24 the gas, with entrained particulates contained therein are directed to filter tank 57.

Within filter tank 57, can be placed a second filtering medium, such as a plurality of elongated fibers or another porous material (such as a woven fabric, a non-woven fabric blanket, a polymer, or a ceramic foam). The purpose the second filtering medium is to capture at least some, preferably the majority and most preferably, most of the particulates entrained in the coolant gas entering entry port 54 of centrifugal unit 24. The fibers that can be employed within fiber tank 57 can include those described above for use in filter medium 21. The particulate depleted exit gas 62 exits the filter tank 57 through a plurality of orifices, shown generally at 58, in a wall 59 of fiber tank 57 (best illustrated in FIG. 4). The wall 59 is preferably the rear wall of centrifugal unit 24 and faces replaceable filter 20, such than any existing particulate in the particulate depleted exit gas impinges directly onto filter medium 21 of filter 20. Any centrifugal force unit in addition to centrifugal force unit 24 (for example, any of centrifugal force units 25-30) could operate in the same fashion described in detail with regard to centrifugal unit 24. Some of the coolant gas may be directed into the central opening of centrifugal unit 24 and exit beneath the unit 24 (as shown in the bottom view of FIG. 5). While, the coolant gas has been described as typically comprising air, the embodiments described herein are also applicable to an oxygen enriched, or oxygen deficient, atmosphere as well. It is understood that should the static centrifugal force units described herein not be sufficiently powered by the pressure drop caused by the cooling fan(s) of the server 12, then additional fan(s) (not shown) could be provided within filter assembly 14 in a position downstream of filter 20, or upstream of filter 20, but downstream of entry port 54. Alternatively, the static centrifugal force filtering units could be turned into dynamic centrifugal force filtering units by providing an impeller within the centrifugal force unit to create the cyclonic flow.

The pre-filtering array of centrifugal force units and replaceable surface filter may be fitted as OEM equipment onto new servers at the factory, or may take the form of an accessory to be retrofit to existing servers. The apparatus provides, in combination, a flow through filter as well as a pre-filter that operates by centrifugal force to remove entrained particulates from a moving coolant stream before the coolant gas enters the server.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed:

1. A filter unit for a server chassis, the filter unit comprising:
    a replaceable surface filter;
    a plurality of centrifugal force filter units forming one or more rows of centrifugal force filter units positioned upstream of the replaceable surface filter;

a lattice support defining a plurality of lattice spaces, each of the plurality of lattice spaces receiving a row of the one or more rows of centrifugal force filter units, the lattice support further defining an aperture for receiving the replaceable surface filter; and at least one elastic strip for positioning between the filter unit and the server chassis, wherein each of the plurality of centrifugal force filter units comprises:

a primary surface changing a direction of an incoming flow of coolant gas, the flow of coolant gas containing entrained particulates;

an entry port receiving the flow of coolant gas containing the entrained particulates, the entry port being shaped and positioned to impart the flow of coolant gas from the primary surface;

an inner wall receiving the imparted flow of coolant gas containing the entrained particulates, the inner wall further changing the direction of the flow of coolant gas, thereby creating a cyclonic flow of coolant gas, a first end of the inner wall terminating at the entry port of the centrifugal force filter unit;

an exit port positioned at a second end of the inner wall, the exit port having a total area less than a total area of the entry port, such that a portion of the flow of coolant gas continues to flow against the inner wall reinforcing a cyclonic flow of newly entering coolant gas into the centrifugal force filter unit while most of the entrained particulates are forced through the exit port; and a central opening located between the entry port and the exit port, wherein the central opening is positioned such that an additional portion of the flow of coolant gas exits through the central opening, and wherein the additional portion of the flow of coolant gas combines with the portion of the flow of coolant gas after the portion of the flow of coolant gas passes through an additional filter.

2. The filter unit of claim 1, further comprising a fiber tank adjacent the exit port.

3. The filter unit of claim 2, further comprising fibers in the fiber tank that act as an additional filter associated with each of the plurality of centrifugal force units.

4. The filter unit of claim 3, wherein the fibers in the fiber tank are at least one selected from the group consisting of polyethylene, polypropylene, polyamide, polyester, aromatic polyamide, polyvinylidene fluoride, polyvinyl alcohol, polyurethane, fibrillated polytetrafluoroethylene, or a composite material consisting of at least two of the foregoing fibers.

5. The filter unit of claim 1, wherein at least one of the plurality of centrifugal force units is a static centrifugal force unit.

6. The filter unit of claim 1, wherein the lattice support comprises a material which is at least one selected from the group consisting of plastic, metal, and composites.

7. The filter unit of claim 1, wherein the at least one elastic strip is sized and shaped to permit cable passage between the server and peripheral equipment.

8. A combination comprising a server and the filter unit of claim 1.

9. The combination of claim 8, wherein the filter unit comprises at least two elastic strips.

10. A method of reducing the amount of particulates entering into a server from a particulate-containing coolant gas, the method comprising:

passing a flow of coolant gas through an intake of a centrifugal force filter unit of a plurality of centrifugal force filter units, the flow of coolant gas containing entrained particulates, the plurality of centrifugal force filter units forming one or more rows of centrifugal force filter units positioned upstream of a replaceable surface filter, wherein a lattice support defines a plurality of lattice spaces, wherein each of the plurality of lattice spaces receives a row of the one or more rows of centrifugal force filter units, and wherein the lattice support further defines an aperture for receiving the replaceable surface filter;

changing, at a primary surface of the centrifugal force filter unit, a direction of the flow of coolant gas entering the intake;

imparting, at an entry port of the centrifugal force filter unit, the flow of coolant gas containing the entrained particulates, further changing, at an inner wall of the centrifugal force filter unit, the direction of the flow of coolant gas containing the entrained particulates, thereby creating a cyclonic flow of coolant gas, wherein a first end of the inner wall terminates at the entry port of the centrifugal force filter unit;

allowing a first portion of the flow of coolant gas through an exit port of the centrifugal force filter unit, a total area of the exit port being less than a total area of the entry port;

filtering the first portion of the flow of coolant gas through a fiber tank adjacent the exit port of the centrifugal force filter unit, thereby reducing the entrained particulates contained in the flow of coolant gas;

redirecting a second portion of the flow of coolant gas back to the inner wall to reinforce a cyclonic flow of newly entering coolant gas into the centrifugal force filter unit;

allowing a third portion of the flow of coolant gas through a central opening of the centrifugal force filter unit, the central opening located between the entry port and the exit port;

combining the first portion of the flow of coolant gas with the third portion of the flow of coolant gas after the first portion of the flow of coolant gas passes through an additional filter; and thereafter filtering the combined first and third portions of the flow of coolant gas containing the reduced entrained particulates through the replaceable surface filter before introducing into the server.

11. The method of claim 10, further comprising causing the passing of the flow of coolant gas through the intake of the centrifugal force filter unit to occur solely due to the pressure drop created by a cooling fan of the server.

12. The method of claim 10, wherein the coolant gas is air.

13. The method of claim 10, wherein the replaceable surface filter is a HEPA filter, and the step of passing the first portion of the flow of coolant gas through the replaceable surface filter comprises removing bacteria, viruses, and allergens from the first portion of the flow of coolant gas.

14. The method of claim 10, further comprising removing volatile organic compounds from the flow of coolant gas by contacting the flow of coolant gas with a charcoal filter.

* * * * *